(12) United States Patent
Iwata (10) Patent No.: US 8,884,680 B2
(45) Date of Patent: Nov. 11, 2014

(54) SIGNAL ELECTRIC POTENTIAL CONVERSION CIRCUIT

(71) Applicant: Panasonic Corporation, Osaka (JP)

(72) Inventor: Toru Iwata, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/056,855

(22) Filed: Oct. 17, 2013

(65) Prior Publication Data

US 2014/0043084 A1 Feb. 13, 2014

Related U.S. Application Data

(63) Continuation of application No. PCT/JP2011/006516, filed on Nov. 22, 2011.

(30) Foreign Application Priority Data

May 13, 2011 (JP) ................................. 2011-107944

(51) Int. Cl.
*H03L 5/00* (2006.01)
*G05F 3/02* (2006.01)
*H03K 19/0185* (2006.01)

(52) U.S. Cl.
CPC ...................................... *G05F 3/02* (2013.01); *H03K 19/018521* (2013.01)
USPC ........................................................ 327/333

(58) Field of Classification Search
None
See application file for complete search history.

(56) References Cited

U.S. PATENT DOCUMENTS

| | | | | |
|---|---|---|---|---|
| 5,880,616 A * | 3/1999 | Park et al. | ...................... | 327/333 |
| 5,907,251 A * | 5/1999 | Houghton | ...................... | 327/108 |
| 7,113,017 B2 * | 9/2006 | Owen | ........................... | 327/333 |
| 7,345,522 B2 * | 3/2008 | Owen | ........................... | 327/333 |
| 7,345,523 B2 * | 3/2008 | Owen | ........................... | 327/333 |
| 7,466,184 B2 * | 12/2008 | Ricard et al. | .................. | 327/333 |
| 8,174,288 B2 * | 5/2012 | Dennard et al. | ................. | 326/81 |
| 2003/0080774 A1 | 5/2003 | Funaba | | |
| 2004/0150459 A1 | 8/2004 | Muto et al. | | |
| 2005/0077953 A1 | 4/2005 | Funaba | | |
| 2008/0309395 A1 * | 12/2008 | Kaneko et al. | ................. | 327/333 |

(Continued)

FOREIGN PATENT DOCUMENTS

| | | |
|---|---|---|
| JP | 06-125261 A | 5/1994 |
| JP | 09-148911 A | 6/1997 |
| JP | 2004-215137 A | 7/2004 |
| JP | 4076079 B2 | 4/2008 |

OTHER PUBLICATIONS

International Search Report issued in International Publication No. PCT/JP2011/006516 with Date of mailing Jan. 17, 2012.

*Primary Examiner* — Lincoln Donovan
*Assistant Examiner* — Khareem E Almo
(74) *Attorney, Agent, or Firm* — McDermott Will & Emery LLP (57) ABSTRACT

In a signal electric potential conversion circuit, a capacitor has one end receiving an input signal CIN, and the other end connected to a termination node N1. A conversion circuit receives a potential IN of the termination node N1. A connection element is provided between a power supply VDDH and the termination node N1, and an impedance of the connection element is reduced when the potential IN is lower than a first potential. Another connection element is provided between the termination node N1 and a ground power supply, and an impedance of the connection element is reduced when the potential IN is higher than a second potential.

11 Claims, 10 Drawing Sheets

(56) References Cited

U.S. PATENT DOCUMENTS

| | | | |
|---|---|---|---|
| 2009/0128215 A1* | 5/2009 | Hsueh | 327/333 |
| 2009/0146723 A1* | 6/2009 | Kimura | 327/333 |
| 2009/0212841 A1* | 8/2009 | Chu et al. | 327/333 |
| 2009/0295451 A1* | 12/2009 | Jordanger et al. | 327/333 |

\* cited by examiner

SIGNAL ELECTRIC POTENTIAL CONVERSION CIRCUIT

CROSS-REFERENCE TO RELATED APPLICATIONS

This is a continuation of International Application No. PCT/JP2011/006516 filed on Nov. 22, 2011, which claims priority to Japanese Patent Application No. 2011-107944 filed on May 13, 2011. The entire disclosures of these applications are incorporated by reference herein.

BACKGROUND

The present disclosure relates to signal electric potential conversion circuits which convert a potential of an input signal to transfer signals having different potentials.

In recent transistors, along with miniaturization of the transistors, an operation voltage has been reduced. A voltage standard of external interfaces is predetermined, and integrated circuits have to be operated at, e.g., 5 V or 3.3 V to be able to be connected to conventional devices. Therefore, level shift circuits (signal electric potential conversion circuits) have been used to transmit or receive signals driven by miniaturized transistors and signals driven at, e.g., 5 V or 3.3 V. In particular, it is useful to use an AC coupling circuit in which a capacitor and a resistance are used in order to transmit a high-speed signal.

Japanese Patent No. 4076079 discloses, as an example of a signal electric potential conversion circuit in which AC coupling is used, a configuration which can correctly maintain output data by allowing an amplifier to have an offset input and offsetting the amplifier by a potential difference of input signals.

SUMMARY

Figure 12A:
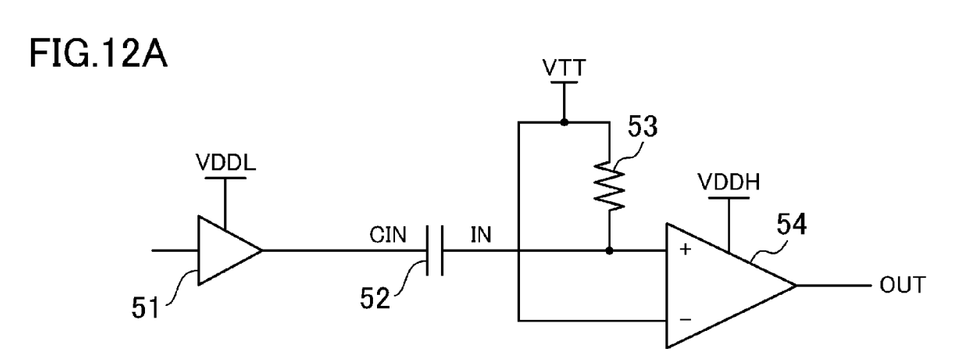
FIGS. 12A and B show a configuration of a general signal electric potential conversion circuit in which AC coupling is used.
Figure 12B:
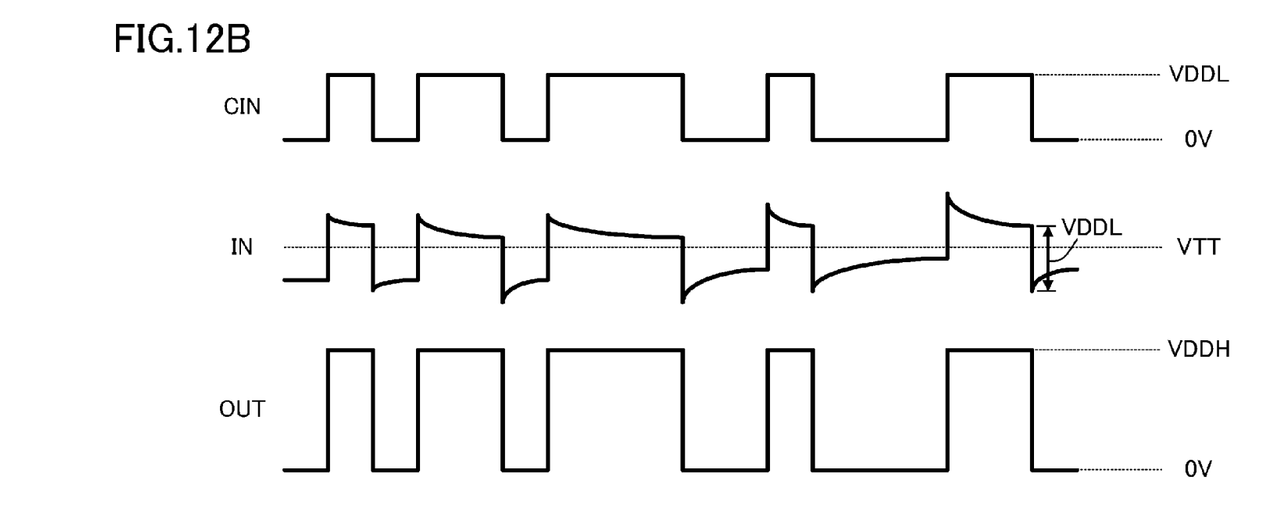

FIG. 12 shows a general signal electric potential conversion circuit in which AC coupling is used, and FIG. 12A shows a circuit configuration and FIG. 12B shows its operation. In FIG. 12, a drive circuit 51 is operated by a low voltage power supply VDDL, and an amplitude of an output signal CIN thereof is VDDL. A receiver circuit 54 is biased toward a point at which an operation is appropriately performed, and outputs an output signal OUT having an amplitude VDDH upon receiving a signal IN. In other words, the receiver circuit 54 sets the voltage of the output signal OUT to VDDH or 0 V depending on whether the voltage of the signal IN is higher or lower than a reference potential.

A termination resistor 53 terminates a node connected to one end of the capacitor 52 to the reference potential VTT. If the capacitance value of the capacitor 52 is sufficiently larger than a load capacitance, the potential of the signal IN varies within the amplitude VDDL with respect to the reference potential VTT as a reference according to the variation of the signal CIN.

However, in the configuration of FIG. 12, the potential of the signal IN, after the transition thereof, is gradually close to the reference potential VTT according to the capacitance value of the capacitor 20 and the resistance value of the termination resistor 40. Therefore, if, for example, a signal transition interval is long due to long sequence of the same data value, a voltage drop occurs in the potential of the signal IN. If the signal transition waveform has a gradient, a time when the signal IN crosses the reference potential VTT depends on the potential immediately before the signal transition. In other words, according to the data pattern of the signal CIN, a time when the signal IN crosses the reference potential VTT is shifted, thereby causing jitter in the output signal OUT after conversion. This problem becomes pronounced in a high-speed operation of, e.g., a GHz order that highly requires consideration of the gradient of the signal transition waveform.

In Japanese Patent No. 4076079, the potential difference of the input signals offsets the amplifier, thereby making it possible to correctly maintain output data even if the termination resistor attenuates the input potential difference. However, if the signal transition waveform has a gradient, in the configuration of Japanese Patent No. 4076079, the pulse width of the data signal OUT after conversion differs from a pulse width of the input signal IN and a pulse width of the input signal/IN. Therefore, even the configuration of Japanese Patent No. 4076079 causes jitter depending on the data pattern, and the problem described above is not solved.

In view of the above problem, it is an object of the present disclosure to provide a signal electric potential conversion circuit having a configuration that does not attenuate a potential of a termination node to prevent occurrence of jitter in a signal after conversion.

In one aspect of the present disclosure, a signal electric potential conversion circuit, includes: a capacitor having one end receiving an input signal, and having the other end connected to a termination node; and a termination circuit configured to receive a potential of the termination node, wherein the termination circuit includes a first connection element provided between a first power supply and the termination node, and a second connection element provided between the termination node and a second power supply having a power supply voltage lower than that of the first power supply, an impedance of the first connection element is reduced when the potential of the termination node is lower than a first potential higher than the power supply voltage of the second power supply, and an impedance of the second connection element is reduced when the potential of the termination node is higher than a second potential which is lower than the power supply voltage of the first power supply and which is higher than the first potential.

According to this aspect, when the potential of the termination node is lower than the first potential, the impedance of the first connection element provided between the first power supply and the termination node is reduced to pull up the potential of the termination node. When the potential of the termination node is higher than the second potential, the impedance of the second connection element provided between the termination node and the second power supply is reduced to pull down the potential of the termination node. With this feature, the potential of the termination node is defined in a range from the first potential to the second potential. When the potential of the termination node is in the range from the first potential to the second potential, the impedance of the first connection element and the impedance of the second connection element are not reduced, and no current flows. Therefore, the potential of the termination node is not attenuated.

According to the present disclosure, a potential of a termination node can be defined within a predetermined range while being prevented from being attenuated. This makes it possible to prevent occurrence of jitter in a signal after conversion.

DETAILED DESCRIPTION

In the following embodiments, a power supply and a power supply voltage thereof will be described by the same reference character as long as no problem occurs.

First Embodiment

Figure 1:
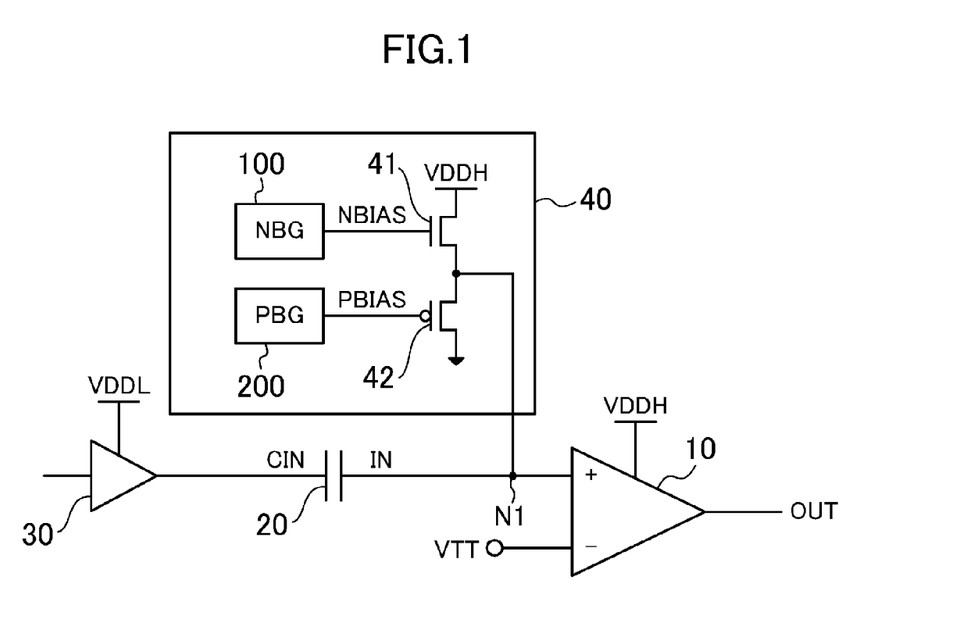
FIG. 1 shows a configuration of a signal electric potential conversion circuit according to a first embodiment.
Figure 2:
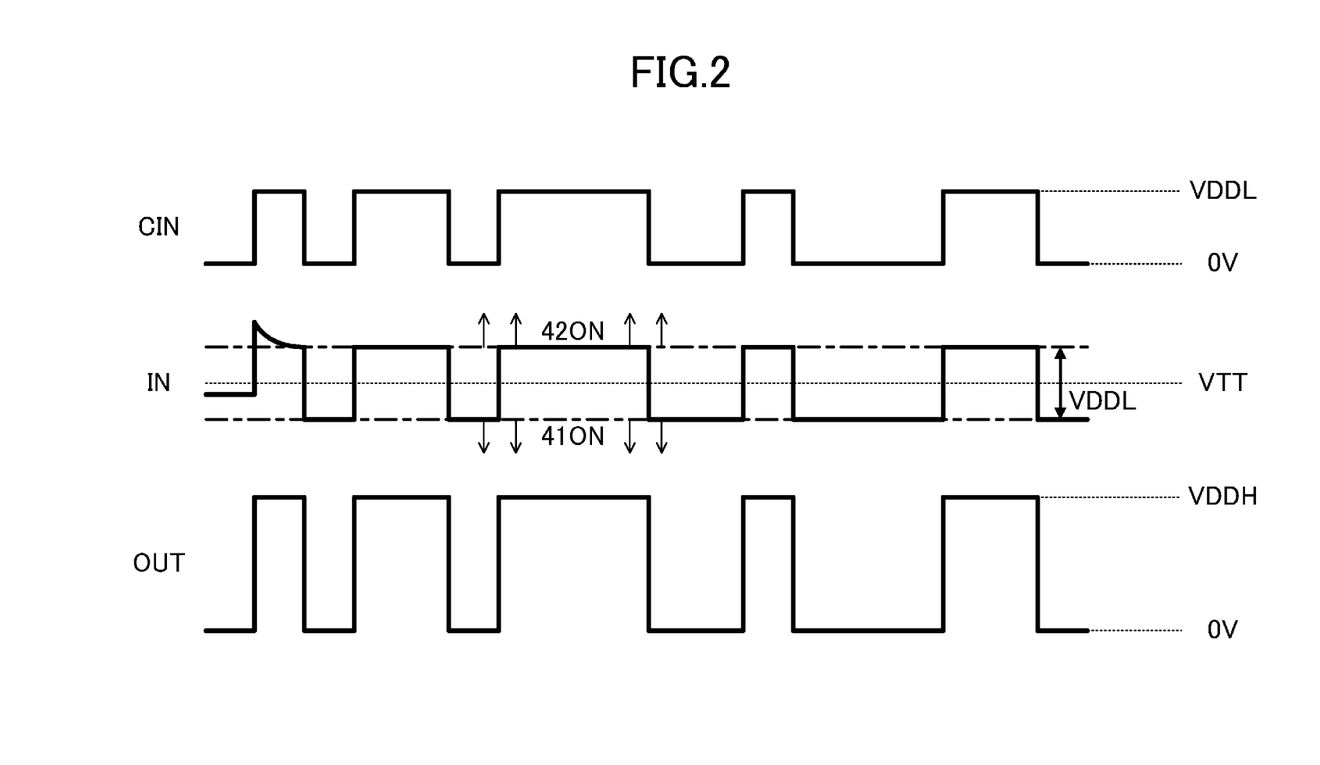
FIG. 2 is a timing chart showing the operation of the signal electric potential conversion circuit of FIG. 1.

FIG. 1 shows a configuration of a signal electric potential conversion circuit and a configuration around the circuit according to a first embodiment. The signal electric potential conversion circuit shown in FIG. 1 utilizes AC coupling. In FIG. 1, a reference character 10 refers to a receiver circuit which receives a signal IN of a termination node N1 and generates an output signal OUT, a reference character 20 refers to a capacitor one end of which receives an input signal CIN and the other end of which is connected to the termination node N1, a reference character 30 refers to a signal drive circuit which drives the input signal CIN, and a reference character 40 refers to a termination circuit which receives an electric potential (i.e., potential) (the signal IN) of the termination node N1. The capacitor 20 and the termination circuit 40 form the signal electric potential conversion circuit according to the embodiment. FIG. 2 is a timing chart showing the operation of the signal electric potential conversion circuit shown in FIG. 1.

A power supply voltage VDDL is applied to the signal drive circuit 30, and the signal drive circuit 30 outputs the signal CIN whose amplitude is VDDL. A power supply voltage VDDH is applied to the receiver circuit 10, and the receiver circuit 10 amplifies the potential of the signal IN with respect to the reference potential VTT to generate the output signal OUT whose amplitude is VDDH. In order that the receiver circuit 10 properly operates, the signal IN has to swing around the reference potential VTT. The termination circuit 40 has a function of changing a signal potential such that the signal IN swings around the reference potential.

The termination circuit 40 specifically includes a NMOS transistor 41 having a drain connected to a power supply VDDH serving as a first power supply and having a source connected to the termination node N1, and a PMOS transistor 42 having a drain connected to ground power supply serving as a second power supply and having a source connected to the termination node N1. In other words, the NMOS transistor 41 serving as a first connection element and the PMOS transistor 42 serving as a second connection element terminate an input node of the receiver circuit 10. A control potential NBIAS generated by the control potential generating circuit 100 (denoted by "NBG" in the figure) is given to a gate of the NMOS transistor 41, and a control potential PBIAS generated by the control potential generating circuit 200 (denoted by "PBG" in the figure) is given to a gate of the PMOS transistor 42.

In the embodiment, as shown in FIG. 2, the control potential generating circuit 100 controls the control potential NBIAS so that the NMOS transistor 41 is turned ON when the potential of the signal IN is lower than (VTT−VDDL/2). The control potential generating circuit 200 controls the control potential PBIAS so that the PMOS transistor 42 is turned ON when the potential of the signal IN is higher than (VTT+VDDL/2).

As described in the problem to be solved, if the termination resistor is used for the termination to the reference potential VTT, the signal potential is attenuated due to a time constant defined by the value of the termination resistor and the value of the capacitor. Therefore, at a time of long sequence of the same data value or when a transmission rate is slow, the signal does not swing around the reference potential VTT even if the amplitude of the signal is VDDL. Accordingly, the receiver circuit 10 does not necessarily properly operate.

In contrast, in the embodiment, when the potential of the signal IN is lower than (VTT−VDDL/2) that is a first potential, the NMOS transistor 41 is turned ON to pull up the potential of the signal IN. When the potential of the signal IN is higher than (VTT+VDDL/2) that is a second potential, the PMOS transistor 42 is turned ON to pull down the potential of the signal IN. Thus, the signal IN can reliably transition while having the amplitude VDDL and swinging around the reference potential VTT. Therefore, the level of the input signal CIN can be reliably converted without changing its data width.

If the potential of the signal IN is in a range from (VTT−VDDL/2) to (VTT+VDDL/2), both of the NMOS transistor 41 and the PMOS transistor 42 are OFF, and no current flows. Thus, in the signal IN, no current load occurs and the potential is not reduced.

FIG. 1 shows a configuration in which the level of a single-phase signal is converted. If the level of a differential signal is converted, the termination circuit 40 may terminate each of signals forming the differential signal. The differential signal is not attenuated regardless of data length or data rate, and therefore, the termination circuit 40 allows a time since the start of the transition until a time when the signals forming the differential signal cross each other to be constant, thereby making it possible to reduce or prevent jitter in the output signal OUT.

The configuration of the embodiment can be applied regardless of the values of the potentials of the power supply voltages VDDL and VDDH. Thus, if VDDL is low and VDDH is high, e.g., VDDL is 1.2 V and VDDH is 3.3 V, the reference potential VTT is set to about the middle value of the voltage VDDH, thereby obtaining an advantage of enhancing the sensitivity of the receiver circuit 10 to achieve high speed operation of the receiver circuit 10.

Even if VDDL is high and VDDH is low, the configuration of the embodiment is effective. For example, in a configuration in which VDDL is 3.3 V and VDDH is 1.2 V and the input signal CIN is clamped to 3.3 V like an open drain circuit, the amplitude of the input signal CIN can be 1.2 V or less because of the clamp effect. However, since the maximum potential of the input signal CIN is 3.3 V, a low-voltage transistor cannot directly receive the signal. When the signal electric potential conversion circuit in the embodiment is applied and the reference potential VTT is set to about the middle value of the voltage VDDH, a low-voltage transistor can form the receiver circuit 10.

In this case, the first potential defining the lower limit of the potential of the signal IN is (VTT−VDDL/2), and the second potential defining the upper limit of the potential of the signal IN is (VTT+VDDL/2). The first potential and the second potential are not limited to these values. For example, the first potential and the second potential may be set such that the intermediate potential between the first potential and the second potential is different from the reference potential VTT so that the signal IN is offset from the reference potential VTT.

The configuration of the embodiment is particularly effective to transmit a high-speed signal. In particular, if a signal of several GHz or more (for example, 3-6 GHz or more) is transmitted, the conventional signal electric potential conversion circuit may not adequately operate, and the configuration of the embodiment is quite effective.

(Configuration of Control Potential Generating Circuit)

Figure 3:
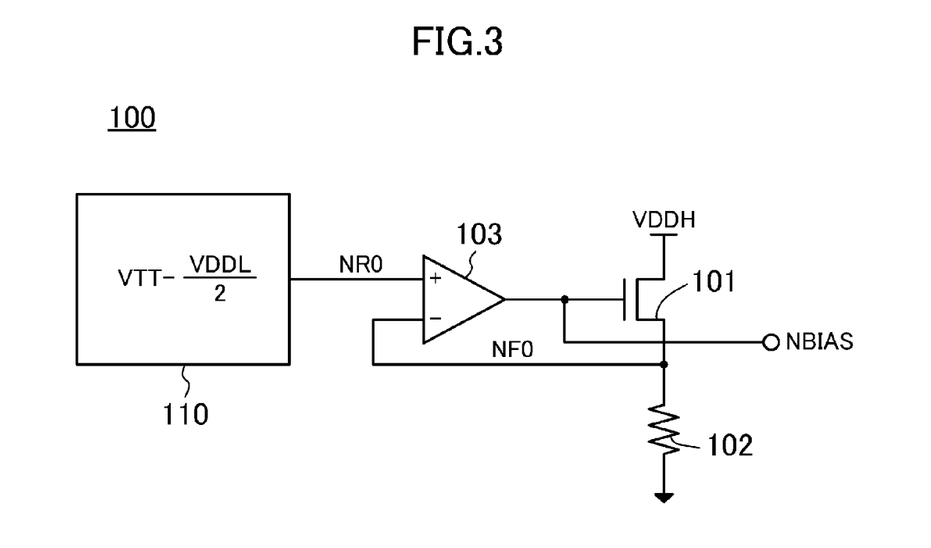
FIG. 3 is an example configuration of a control potential generating circuit in FIG. 1.

FIG. 3 is an example configuration of the control potential generating circuit 100 shown in FIG. 1. In FIG. 3, a reference character 110 refers to a bias circuit which generates and transmits a predetermined potential, a reference character 101 refers to an NMOS transistor which has a drain connected to the power supply VDDH and which serves as a second NMOS transistor, a reference character 102 refers to a load circuit one end of which is connected to a source of the NMOS transistor 101 and the other end of which is connected to ground power supply, and a reference character 103 refers to an amplifier circuit whose input is connected to an output node NR0 of the bias circuit 110 and a source node NF0 connected to a source of the NMOS transistor 101, and whose output is connected to a gate of the NMOS transistor 101.

The bias circuit 110 generates a potential (VTT−VDDL/2) lower than the reference potential VTT by VDDL/2. The amplifier circuit 103 compares the potential of the output node of the bias circuit 110 with a source potential of the NMOS transistor 101, and controls a gate potential of the NMOS transistor 101 such that the potential of the output node of the bias circuit 110 and the source potential of the NMOS transistor 101 are equal to each other. The gate potential of the NMOS transistor 101 controlled by the amplifier circuit 103 is output as a control potential NBIAS. The source potential of the NMOS transistor 101 is (VTT−VDDL/2), and therefore, a sufficiently high resistance value of the load circuit 102 can allow the NMOS transistor 101 to be slightly ON.

The NMOS transistor 101 and the NMOS transistor 41 forming the termination circuit 40 have the same drain voltage (the power supply voltage VDDH in this embodiment), and they are also assumed to have the same threshold voltage. In this case, if the voltage of the signal IN is getting lower than (VTT−VDDL/2), the NMOS transistor 41 is turned ON, and current abruptly flows. Therefore, the potential of the signal IN rarely gets lower than (VTT−VDDL/2). In other words, the configuration shown in FIG. 3 achieves the control potential generating circuit 100 that controls the control potential NBIAS such that the NMOS transistor 41 is turned ON when the potential of the signal IN is lower than (VTT−VDDL/2).

Figure 4:
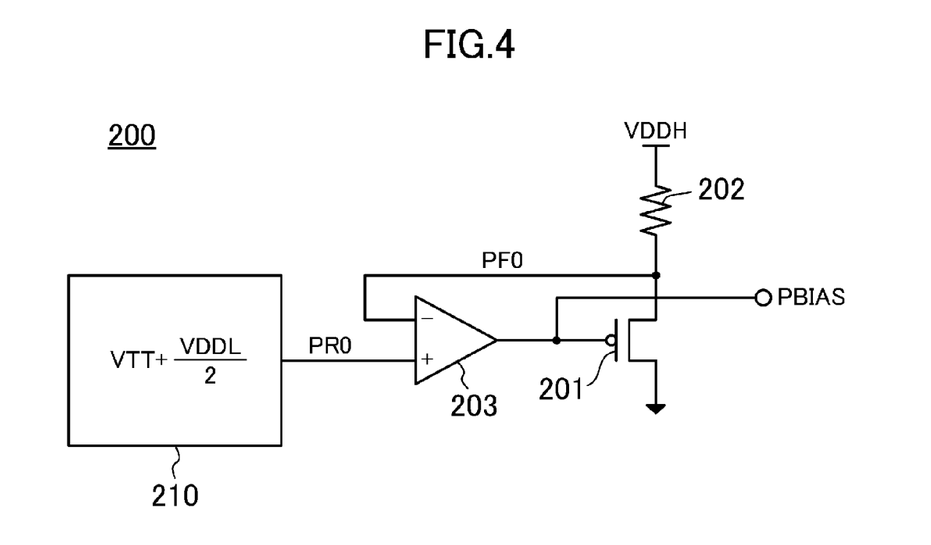
FIG. 4 is an example configuration of a control potential generating circuit in FIG. 1.

FIG. 4 is an example configuration of the control potential generating circuit 200 shown in FIG. 1. The control potential generating circuit 200 may be obtained by modifying the configuration of the control potential generating circuit 100 shown in FIG. 3, thus, replacing the NMOS transistor 101 with a PMOS transistor 201, reversing the position of a load circuit 202 relative to the power supply and the ground, and setting a bias voltage output from a bias circuit 210 to (VTT+VDDL/2). An amplifier circuit 203 has an input connected to an output node PR0 of the bias circuit 210 and a source node PF0 connected to a source of the PMOS transistor 201, and has an output connected to a gate of the PMOS transistor 201.

The amplifier circuit 203 compares the potential of the output node of the bias circuit 210 with a source potential of the PMOS transistor 201, and controls a gate potential of the PMOS transistor 201 such that the potential of the output node of the bias circuit 210 and the source potential of the PMOS transistor 201 are equal to each other. The potential of the gate of the PMOS transistor 201 controlled by the amplifier circuit 203 is output as a control potential PBIAS. The configuration in FIG. 4 achieves the control potential generating circuit 200 that controls the control potential PBIAS such that the PMOS transistor 42 is turned ON when the potential of the signal IN is higher than (VTT+VDDL/2).

(Configuration of Bias Circuit)

Figure 5:
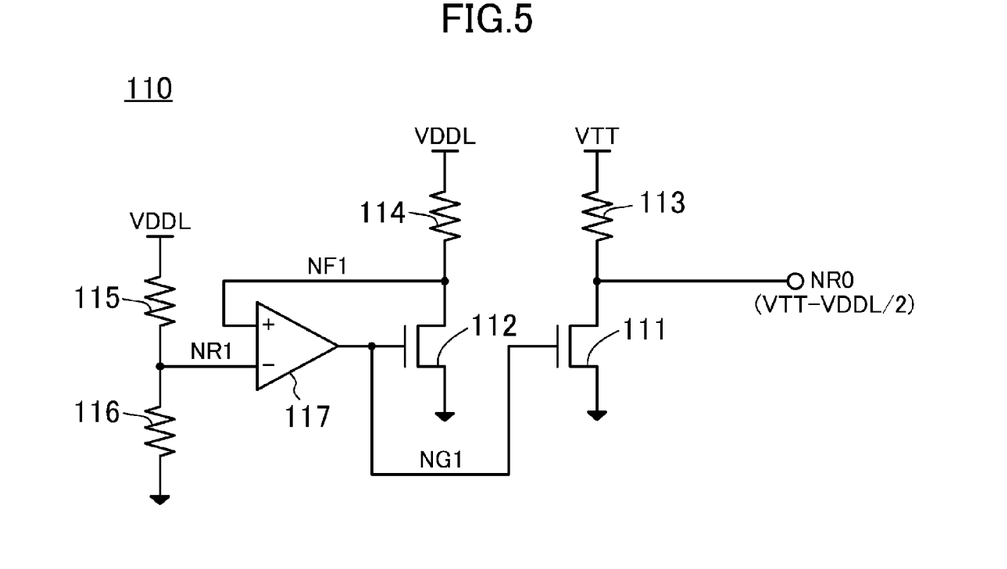
FIG. 5 is a first example configuration of a bias circuit in FIG. 3.

FIG. 5 is a first example configuration of the bias circuit shown in FIG. 3. In FIG. 5, reference characters 111 and 112 refer to NMOS transistors, reference characters 113-116 refer to resistances, and a reference character 117 refers to an amplifier circuit.

The resistances 115 and 116 divide the power supply voltage VDDL, and the potential after dividing the voltage is output to a connection node NR1. If the resistance value of the resistance 115 is equal to that of the resistance 116, the potential of the connection node NR1 is VDDL/2.

The source of the NMOS transistor 112 is connected to ground, and the drain of the NMOS transistor 112 is connected to one end of the resistance 114. The other end of the resistance 114 is connected to the power supply VDDL. The amplifier circuit 117 controls the potential of a gate of the NMOS transistor 112 such that the potential of a drain node NF1 connected to a drain of the NMOS transistor 112 is equal to the potential of the connection node NR1. As a result, the potential of the drain node NF1 is VDDL/2. The current flowing through the NMOS transistor 112 is equal to the current flowing through the resistance 114, and the potential difference between both ends of the resistance 114 is VDDL/2. In other words, the current flowing through the NMOS transistor 112 generates a potential drop of VDDL/2 across the resistance 114.

The NMOS transistor 111 and the resistance 113 are arranged to have a mirror relationship with the NMOS transistor 112 and the resistance 114. One end of the resistance 113 serving as the load circuit is connected to a power supply supplying the reference potential VTT. The drain of the NMOS transistor 111 is connected to the other end of the resistance 113, and the source of the NMOS transistor 111 is connected to ground. Since a gate node NG1 connected to the gate of the NMOS transistor 111 is connected to the output of the amplifier circuit 117, the current flowing through the NMOS transistor 111 generates a potential drop of VDDL/2 across the resistance 113. Since the power supply supplying the reference potential VTT is connected to the resistance 113, the potential of the drain of the NMOS transistor 111, thus, the potential of a concoction point NR0 at which the NMOS transistor 111 and the resistance 113 are connected together is (VTT−VDDL/2). The potential of the concoction point NR0 is output as a bias voltage.

In the configuration in FIG. 5, the potential of the drain node NF1 of the NMOS transistor 112 and the potential of the connection node NR1 of the resistances 115 and 116 are compared with each other. Instead of the NMOS transistor 112, a PMOS transistor may be used, and the position of the resistances and the position of the PMOS transistor may be reversed relative to the power supply to generate a current corresponding to the VDDL/2. However, in this case, the source potential of the PMOS transistor has to be set higher than the reference potential VTT.

Figure 6:
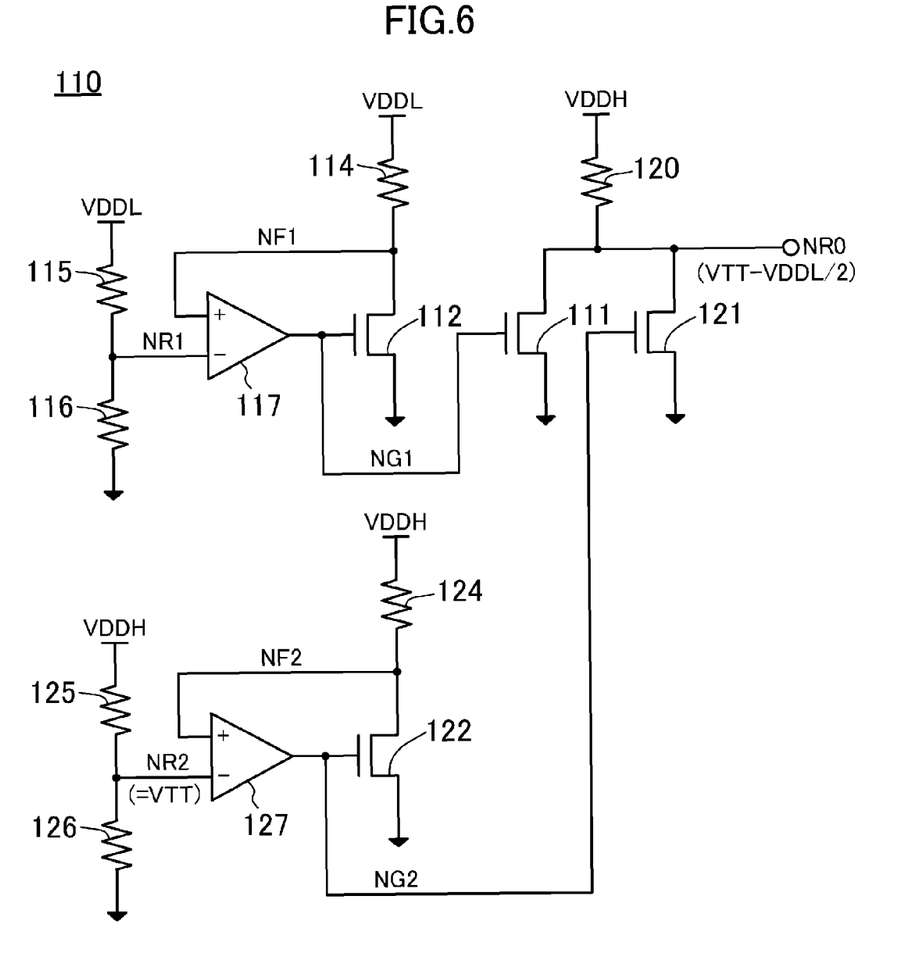
FIG. 6 is a second example configuration of the bias circuit in FIG. 3.

FIG. 6 is a second example configuration of the bias circuit 110 shown in FIG. 3. The configuration of FIG. 6 is obtained by partially modifying the configuration of FIG. 5 and adding elements to the modified configuration of FIG. 5. Each element also shown in FIG. 5 is identified by the same reference character in FIG. 5. Reference characters 121 and 122 refer to NMOS transistors, reference characters 120 and 124-126 refer to resistances, and a reference character 127 refers to an amplifier circuit.

The resistances 125 and 126 divide the power supply voltage VDDH to generate a reference potential VTT. The reference potential VTT which has been generated is output to a connection node NR2. For example, if the reference potential VTT is set to VDDH/2, the resistance value of the resistance 125 may be equal to that of the resistance 126.

A source of the NMOS transistor 122 is connected to ground, and a drain of the NMOS transistor 122 is connected to one end of the resistance 124. The other end of the resistance 124 is connected to the power supply VDDH. The amplifier circuit 127 controls a gate potential of the NMOS transistor 122 such that the potential of a drain node NF2 connected to the drain of the NMOS transistor 122 is equal to the potential of a connection node NR2. As a result, the potential of the drain node NF2 is VTT. The current flowing through the NMOS transistor 122 is equal to the current flowing through the resistance 124, and the potential difference between both ends of the resistance 124 is (VDDH−VTT). In other words, the current flowing through the NMOS transistor 122 generates a potential drop of (VDDH−VTT) across the resistance 124.

The NMOS transistor 121 is provided to have a mirror relationship with the NMOS transistor 122. The resistance 120 is provided so as to have the relationship with the resistances 114 and 124 according to the mirror relationship between the NMOS transistors 111 and 112 and the mirror relationship between the NMOS transistors 121 and 122. One end of the resistance 120 serving as the load circuit is connected to the power supply VDDH. In each of the NMOS transistors 111 and 121, a drain thereof is connected to the other end of the resistance 120, and a source thereof is connected to ground. A gate node NG2 connected to the gate of the NMOS transistor 121 is connected to an output of the amplifier circuit 127, and therefore, current flowing through the NMOS transistor 121 generates a potential drop of (VDDH−VTT) across the resistance 120. As a result, the potential of the drains of the NMOS transistors 111 and 121, thus, the potential of a connection point NR0 at which the NMOS transistors 111 and 121 and the resistance 120 are connected together is expressed as follows:

$$VDDH-(VDDH-VTT)-VDDL/2=VTT-VDDL/2$$

The potential of the connection point NR0 is output as a bias voltage.

The bias circuit 210 shown in FIG. 4 can also be configured in the same manner as the configurations shown in FIGS. 5 and 6.

Figure 7:
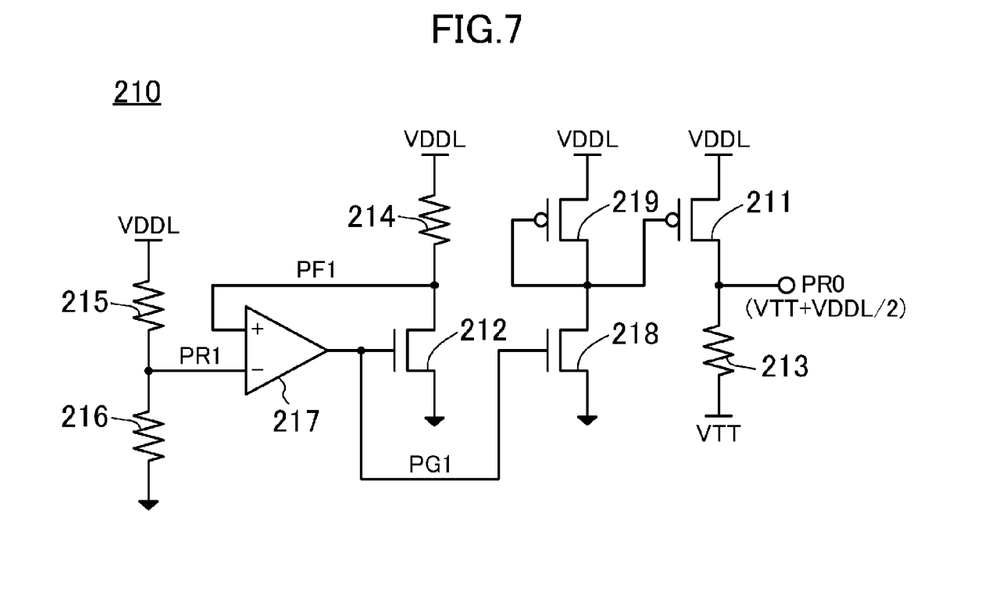
FIG. 7 is a first example configuration of a bias circuit in FIG. 4.

FIG. 7 is a first example configuration of the bias circuit 210 shown in FIG. 4. In FIG. 7, reference characters 211 and 219 refer to PMOS transistors, reference characters 212 and 218 refer to NMOS transistors, reference characters 213-216 refer to resistances, and a reference character 217 refers to an amplifier circuit.

The resistances 215 and 216 divide the power supply voltage VDDL, and the potential after dividing the voltage is output to a connection node PR1. If the resistance value of the resistance 215 is equal to that of the resistance 216, the potential of the connection node PR1 is VDDL/2.

An amplifier circuit 217 controls a gate potential of the NMOS transistor 212 such that the potential of a drain node PF1 connected to a drain of the NMOS transistor 212 is equal to the potential of the connection node PR1. The current flowing through the NMOS transistor 212 generates a potential drop of VDDL/2 across the resistance 214.

A gate node PG1 connected to a gate of the NMOS transistor 218 is connected to an output of the amplifier circuit 217, and the current flowing through the NMOS transistor 212 is mirrored to a current source that is the PMOS transistor 219. A drain of the PMOS transistor 211 is connected to the power supply VTT through the resistance 213, where the PMOS transistor 211 and the PMOS transistor 219 have a mirror relationship and the resistance 213 and the resistance 214 have a mirror relationship. In other words, one end of the resistance 213 serving as a load circuit is connected to a power supply supplying the reference potential VTT. The drain of the PMOS transistor 211 is connected to the other end of the resistance 213, and the source of the PMOS transistor 211 is connected to a power supply VDDL having a power supply voltage higher than that of the power supply VTT. As a result, the potential of the drain of the PMOS transistor 211, thus, the potential of a connection point PR0 at which the PMOS transistor 211 and the resistance 213 are connected together is (VTT+VDDL/2). The potential of the connection point PR0 is output as a bias voltage.

Figure 8:
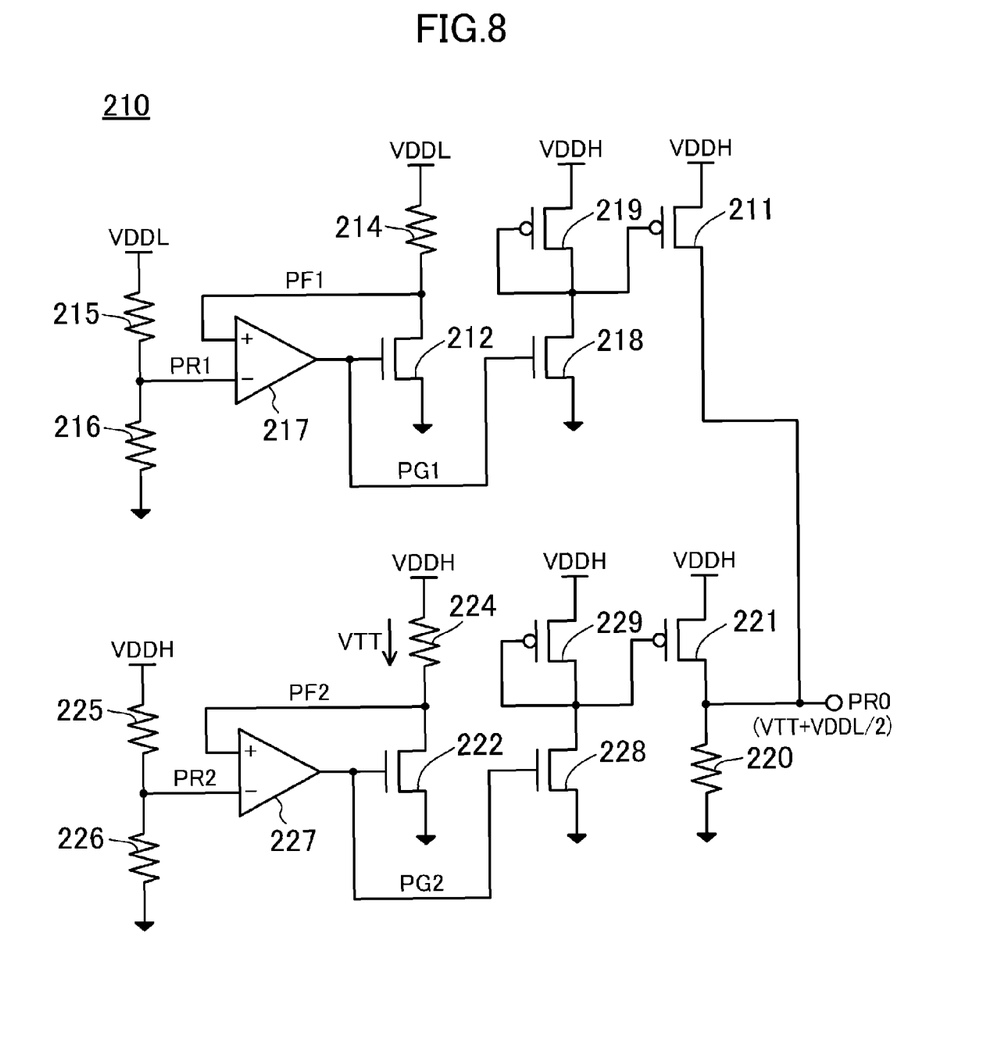
FIG. 8 is a second example configuration of the bias circuit in FIG. 4.

FIG. 8 is a second example configuration of the bias circuit 210 shown in FIG. 4. The configuration of FIG. 8 is obtained by partially modifying the configuration of FIG. 7 and adding elements to the modified configuration of FIG. 7. Each element also shown in FIG. 7 is identified by the same reference character in FIG. 7. Reference characters 221 and 229 refer to PMOS transistors, reference characters 222 and 228 refer to NMOS transistor, reference characters 220 and 224-226 refer to resistances, and a reference character 227 refers to an amplifier circuit.

The resistances 225 and 226 divide a power supply voltage VDDH to generate a reference potential VTT. The reference potential VTT which has been generated is output to a connection node PR2 where VTT=VDDH−PR2. For example, if the reference potential VTT is set to VDDH/2, the resistance value of the resistance 225 may be equal to that of the resistance 226.

A source of the NMOS transistor 222 is connected to ground, and a drain of the NMOS transistor 222 is connected to one end of the resistance 224. The other end of the resistance 224 is connected to a power supply VDDH. The amplifier circuit 227 controls a gate potential of the NMOS transistor 222 such that the potential of a drain node PF2 connected to the drain of the NMOS transistor 222 is equal to the potential of the connection node PR2. As a result, the potential of the drain node PF2 is (VDDH−VTT). The current flowing through the NMOS transistor 222 is equal to the current flowing through the resistance 224, and a potential difference between both ends of the resistance 224 is VTT. In other words, the current flowing through the NMOS transistor 222 generates a potential drop of VTT across the resistance 224.

A gate node PG2 connected to a gate of the NMOS transistor 228 is connected to an output of the amplifier circuit 227, and the current flowing through the NMOS transistor 222 is mirrored to a current source that is the PMOS transistor 229. The PMOS transistor 221 is provided to have a mirror relationship with the PMOS transistor 229. One end of the resistance 220 serving as a load circuit is connected to ground. In each of the PMOS transistors 211 and 221, a drain thereof is connected to the other end of the resistance 220, and a source thereof is connected to the power supply VDDH. The current flowing through the PMOS transistor 221 generates a potential drop of VTT across the resistance 220. As a result, the potential of the drains of the PMOS transistors 211 and 221, thus, the potential of a connection point PR0 at which the PMOS transistors 211 and 221 and the resistance 220 are connected together is (VDDL/2+VTT). The potential of the connection point PR0 is output as a bias voltage.

In this embodiment, the NMOS transistor 41 and the PMOS transistor 42 terminates the termination node N1. However, the configuration is not limited to the configuration described above. Thus, a connection element whose impedance is reduced when the potential of the termination node N1 is lower than the first potential can be used instead of the NMOS transistor 41, and a connection element whose impedance is reduced when the potential of the termination node N1 is higher than the second potential can be used instead of the PMOS transistor 42.

Second Embodiment

In the first embodiment, the case where the amplitude of the input signal CIN is VDDL has been described. However, in view of actual communication between devices, the amplitude of the input signal CIN is not necessarily constant but has fluctuation. Therefore, in some cases, the control potentials NBIAS and PBIAS may be adjusted depending on devices to be connected to the signal electric potential conversion circuit. In a second embodiment, a configuration in which control potentials NBIAS and PBIAS are adjustable according to the potential of an input signal CIN will be described.

Figure 9:
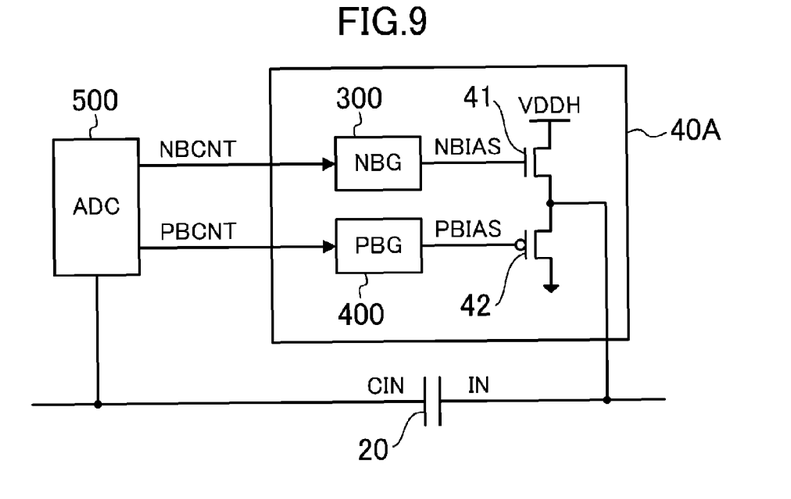
FIG. 9 shows a configuration of a signal electric potential conversion circuit according to a second embodiment.

FIG. 9 shows a configuration of a signal electric potential conversion circuit according to the second embodiment. In FIG. 9, a reference character 500 refers to an AD converter (ADC) serving as a detection circuit that monitors the potential of the input signal CIN, and outputs adjustment signals NBCNT and PBCNT according to the monitoring result. In a termination circuit 40A, a control potential generating circuit 300 (denoted by "NBG" in the figure) generates the control potential NBIAS according to the adjustment signal NBCNT, and a control potential generating circuit 400 (denoted by "PBG" in the figure) generates the control potential PBIAS according to the adjustment signal PBCNT. A capacitor 20, a termination circuit 40A, and the ADC 500 form the signal electric potential conversion circuit in the embodiment.

Figure 10:
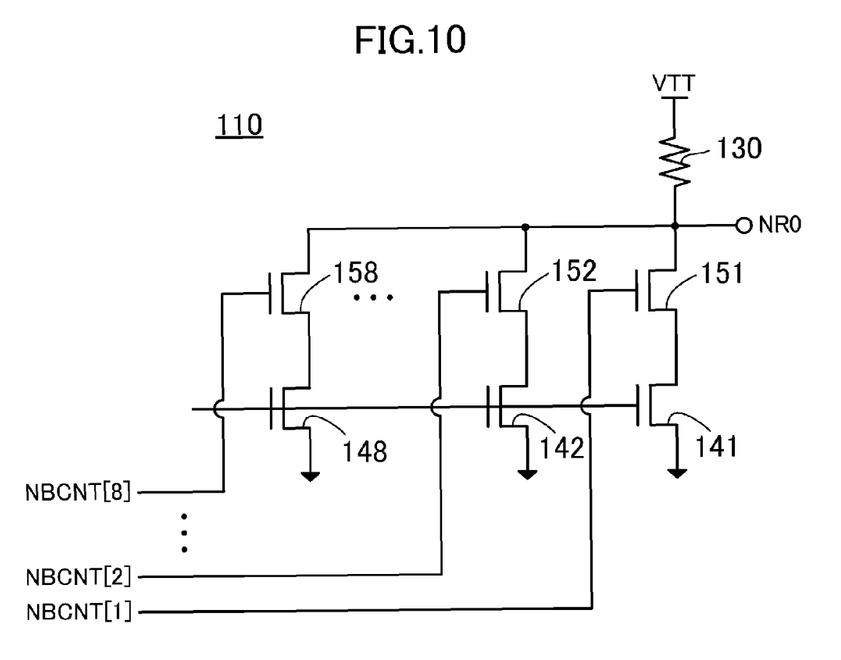
FIG. 10 is an example configuration of a bias circuit in FIG. 9.

The control potential generating circuit 300 may be configured in the same manner as the configuration in FIG. 3, and a bias circuit 110 may be configured as shown in FIG. 10, for example. In FIG. 10, reference characters 141-148 refer to current sources that are NMOS transistors, reference characters 151-158 refer to switches that are NMOS transistors to switch between a state where each of the current sources 141-148 is connected to a node NR0 and a state where each of the current sources 141-148 is not connected to the node NR0, and a reference character 130 refers to a load circuit that is a resistance. In the configuration of FIG. 10, the potential of a node NR0 can be adjusted by adjusting the current flowing through the load circuit 130.

The ADC 500 detects the maximum value and the minimum value of the amplitude of the input signal CIN, outputs the adjustment signal NBCNT according to the minimum value which has been detected, and outputs the adjustment signal PBCNT according to the maximum value which has been detected. For example, assume that the adjustment signal NBCNT is represented by a 8-bit binary code, and current of each of the current sources 141-148 is set to have a value (value of a power of two) corresponding to each bit of the adjustment signal NBCNT. For example, when the size of the NMOS transistor 141 is 1, the size of each of the NMOS transistors 142-148 is set to 2, 4, 8, . . . , 128. This makes it possible to set the current flowing through the load circuit 130 by a 8-bit resolution according to the minimum value of the input signal CIN. A voltage drop occurs across the load circuit 130 according to the set current value, and a bias voltage lower than the reference potential VTT by a predetermined potential is output from the node NR0.

In the configuration of FIG. 10, the set voltage corresponding to the amplitude of the input signal CIN is output from the node NR0. Instead of this configuration, for example, the voltage of the connection node NR1 in FIG. 5 may be adjusted according to the amplitude of the input signal CIN. Alternatively, for example, instead of the NMOS transistor 111, the current sources 141-148 and the switches 151-158 shown in FIG. 10 may be applied in the bias circuit shown in FIG. 6.

The control potential generating circuit 400 in FIG. 9 can be easily configured by, e.g., providing the configuration of FIG. 4, and modifying the bias circuit 210 by applying the configuration of FIG. 10. For example, the current generated by the current source that is the NMOS transistor may be mirrored to the PMOS transistor and the mirrored current flows into the termination resistor. The NMOS transistor may be replaced with the PMOS transistor, and the polarity of the power supply and the polarity of the signal may be reversed.

The configuration of the bias circuit used in the embodiment is not limited to the configuration in which a plurality of current sources are used as shown in FIG. 10. For example, a configuration in which the resistance ratio between the resistances 115 and 116 in the configuration in FIG. 5 is adjustable according to the amplitude of the input signal CIN detected by the ADC 300 may be utilized.

Third Embodiment

Figure 11:
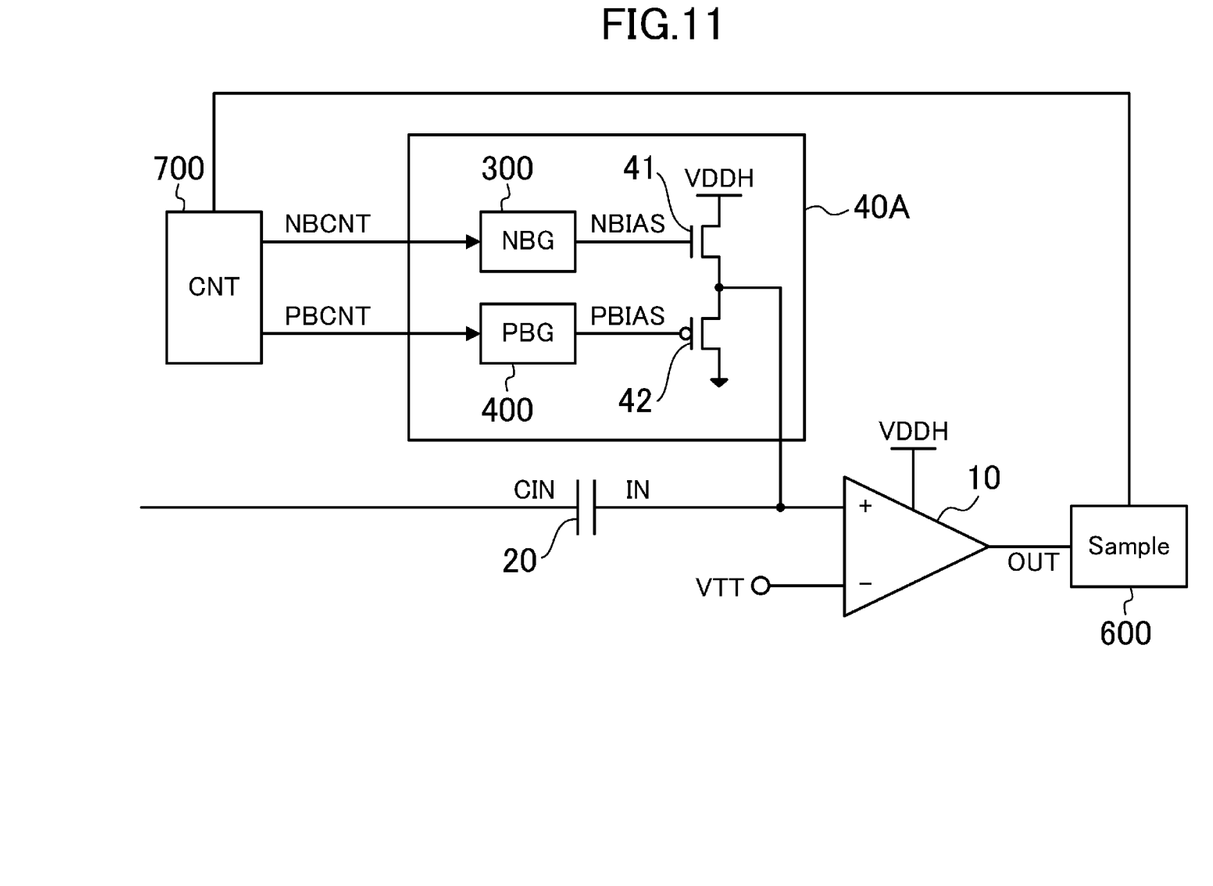
FIG. 11 shows a configuration of a signal electric potential conversion circuit according to a third embodiment.

FIG. 11 shows a configuration of a signal electric potential conversion circuit according to a third embodiment. In FIG. 11, a reference character 600 refers to a determination circuit which determines an output signal OUT of a receiver circuit 10, and a reference character 700 refers to an adjustment circuit which receives the determination result of the determination circuit 600 and which outputs adjustment signals NBCNT and PBCNT according to the determination result. A capacitor 20, a termination circuit 40A, the determination circuit 600, and the adjustment circuit 700 form the signal electric potential conversion circuit in the embodiment.

Control potentials NBIAS and PBIAS are adjusted so as to be optimum relative to the amplitude of a signal IN in order to reduce or prevent jitter depending on a data pattern of the signal OUT output from the receiver circuit 10. Therefore, the output signal OUT may be observed and the control potentials NBIAS and PBIAS may be controlled such that the jitter value of the output signal OUT is the minimum value. Thus, the adjustment circuit 700 outputs the adjustment signals NBCNT and PBCNT to control control potential generating circuits 300 and 400 as well as the ADC 500 shown in the second embodiment. The adjustment circuit 700 gradually changes the adjustment signals NBCNT and PBCNT, determines whether data determined by the determination circuit 600 is correct every time when the signal is changed, and searches and sets values of the adjustment signals NBCNT and PBCNT such that the determination result is correct as much as possible. This makes it possible to control reduce or prevent jitter of the output signal OUT.

The adjustment circuit 700 does not necessarily have the function of searching the set values of the adjustment signals NBCNT and PBCNT. If there is an external element having a function of being able to set the values of the adjustment signals NBCNT and PBCNT, it is possible, by software control, for example, to set the values of the adjustment signals NBCNT and PBCNT such that jitter of the output signal OUT is reduced or prevented by utilizing a relationship between correct/incorrect result of the data determined by the determination circuit 600 and the set values of the adjustment signals NBCNT and PBCNT.

In this description, the determination circuit 600 has been described as a circuit determining the output signal OUT, but is not limited to such a circuit. For example, a circuit comparing the phase of a standard time with the phase of the output signal OUT may be utilized. In this case, the set values of the adjustment signals NBCNT and PBCNT may be searched such that the phase comparison result is stable.

A signal electric potential conversion circuit according to the present disclosure can define the potential of a termination node in a predetermined range while preventing attenuation of the potential of the termination node, and therefore, for example, is effective for use in a high-speed interface circuit.

What is claimed is:

1. A signal electric potential conversion circuit, comprising:
    a capacitor having one end receiving an input signal, and having the other end connected to a termination node; and
    a termination circuit configured to receive a potential of the termination node, wherein
    the termination circuit includes:
        a first connection element provided between a first power supply and the termination node, and
        a second connection element provided between the termination node and a second power supply having a power supply voltage lower than that of the first power supply,
    an impedance of the first connection element is reduced when the potential of the termination node is lower than a first potential higher than the power supply voltage of the second power supply, and
    an impedance of the second connection element is reduced when the potential of the termination node is higher than a second potential which is lower than the power supply voltage of the first power supply and which is higher than the first potential,
    wherein the termination circuit includes:
        a first NMOS transistor serving as the first connection element, and having a drain connected to the first power supply, and a source connected to the termination node; and
        a control potential generating circuit configured to generate a control potential which is to be given to a gate of the first NMOS transistor,
    wherein the control potential generating circuit includes:
        a bias circuit configured to generate and output the first potential;
        a second NMOS transistor having a drain connected to the first power supply; and
        a first load circuit having one end connected to a source of the second NMOS transistor, and the other end connected to the second power supply, and
    wherein the control potential generating circuit controls a gate potential of the second NMOS transistor such that a source potential of the second NMOS transistor is equal to the first potential output from the bias circuit, and outputs the gate potential of the second NMOS transistor as the control potential.

2. The signal electric potential conversion circuit of claim 1, wherein the bias circuit includes:
    a second load circuit having one end connected to a third power supply supplying a reference potential; and
    a third NMOS transistor having a drain connected to the other end of the second load circuit, and a source connected to the second power supply, and
    the bias circuit controls a gate potential of the third NMOS transistor such that a voltage drop across the second load circuit is equal to a predetermined voltage, and outputs a drain potential of the third NMOS transistor as the first potential.

3. The signal electric potential conversion circuit of claim 1, wherein the bias circuit includes:
    a second load circuit having one end connected to the first power supply;
    a third NMOS transistor having a drain connected to the other end of the second load circuit, and a source connected to the second power supply; and
    a fourth NMOS transistor having a drain connected to the other end of the second load circuit, and a source connected to the second power supply,
    the bias circuit:
    controls a gate potential of the third NMOS transistor such that a voltage drop across the second load circuit by current flowing through the third NMOS transistor is equal to a predetermined voltage,
    controls a gate potential of the fourth NMOS transistor such that a voltage drop across the second load circuit by current flowing through the fourth NMOS transistor is equal to a voltage obtained by subtracting a reference potential from the power supply voltage of the first power supply, and
    outputs a drain potential of the third and fourth NMOS transistors as the first potential.

4. A signal electric potential conversion circuit, comprising:
    a capacitor having one end receiving an input signal, and having the other end connected to a termination node; and
    a termination circuit configured to receive a potential of the termination node,
    wherein the termination circuit includes:
        a first connection element provided between a first power supply and the termination node, and
        a second connection element provided between the termination node and a second power supply having a power supply voltage lower than that of the first power supply,
    an impedance of the first connection element is reduced when the potential of the termination node is lower than a first potential higher than the power supply voltage of the second power supply, and
    an impedance of the second connection element is reduced when the potential of the termination node is higher than a second potential which is lower than the power supply voltage of the first power supply and which is higher than the first potential, wherein the termination circuit includes:
a first PMOS transistor serving as the second connection element, and having a drain connected to the second power supply, and a source connected to the termination node; and
a control potential generating circuit configured to generate a control potential which is to be given to a gate of the first PMOS transistor,
wherein the control potential generating circuit includes:
a bias circuit configured to generate and output the second potential;
a second PMOS transistor having a drain connected to the second power supply; and
a first load circuit having one end connected to a source of the second PMOS transistor, and the other end connected to the first power supply, and
the control potential generating circuit controls a gate potential of the second PMOS transistor such that a source potential of the second PMOS transistor is equal to the second potential output from the bias circuit, and outputs the gate potential of the second PMOS transistor as the control potential.

5. The signal electric potential conversion circuit of claim 4, wherein the bias circuit includes:
a second load circuit having one end connected to a third power supply supplying a reference potential; and
a third PMOS transistor having a drain connected to the other end of the second load circuit, and a source connected to a fourth power supply having a power supply voltage higher than that of the third power supply, and
the bias circuit controls a gate potential of the third PMOS transistor such that a voltage drop across the second load circuit is equal to a predetermined voltage, and outputs the drain potential of the third PMOS transistor as the second potential.

6. The signal electric potential conversion circuit of claim 4, wherein the bias circuit includes:
a second load circuit having one end connected to the second power supply;
a third PMOS transistor having a drain connected to the other end of the second load circuit, and a source connected to a fourth power supply having a power supply voltage higher than that of the second power supply; and
a fourth PMOS transistor having a drain connected to the other end of the second load circuit, and a source connected to the fourth power supply,
the bias circuit:
controls a gate potential of the third PMOS transistor such that a voltage drop across the second load circuit by current flowing through the third PMOS transistor is equal to a predetermined voltage,
controls a gate potential of the fourth PMOS transistor such that a voltage drop across the second load circuit by current flowing through the fourth PMOS transistor is equal to a reference potential, and
outputs a drain potential of the third and fourth PMOS transistors as the second potential.

7. A signal electric potential conversion circuit, comprising:
a capacitor having one end receiving an input signal, and having the other end connected to a termination node; and
a termination circuit configured to receive a potential of the termination node,
wherein the termination circuit includes:
a first connection element provided between a first power supply and the termination node, and
a second connection element provided between the termination node and a second power supply having a power supply voltage lower than that of the first power supply,
an impedance of the first connection element is reduced when the potential of the termination node is lower than a first potential higher than the power supply voltage of the second power supply, and
an impedance of the second connection element is reduced when the potential of the termination node is higher than a second potential which is lower than the power supply voltage of the first power supply and which is higher than the first potential,
wherein if an amplitude of the input signal is VDDL, and a reference potential after a conversion of the input signal is VTT, the first potential is (VTT−VDDL/2), and the second potential is (VTT+VDDL/2).

8. The signal electric potential conversion circuit of claim 1, further comprising:
a detection circuit configured to monitor a potential of the input signal, and output an adjustment signal according to the monitoring result,
wherein the control potential generating circuit has a function of adjusting the control potential according to the adjustment signal output from the detection circuit.

9. The signal electric potential conversion circuit of claim 1, further comprising:
a determination circuit configured to determine a signal output from a receiver circuit outputting a signal according to the potential of the termination node; and
an adjustment circuit configured to output an adjustment signal according to the determination result by the determination circuit, wherein
the control potential generating circuit has a function of adjusting the control potential according to the adjustment signal output from the adjustment circuit.

10. The signal electric potential conversion circuit of claim 4, further comprising a detection circuit configured to monitor a potential of the input signal, and output an adjustment signal according to the monitoring result,
wherein the control potential generating circuit has a function of adjusting the control potential according to the adjustment signal output from the detection circuit.

11. The signal electric potential conversion circuit of claim 4, further comprising:
a determination circuit configured to determine a signal output from a receiver circuit outputting a signal according to the potential of the termination node; and
an adjustment circuit configured to output an adjustment signal according to the determination result by the determination circuit, wherein
the control potential generating circuit has function of adjusting the control potential according to the adjustment signal output from the adjustment circuit.

* * * * *